United States Patent
Barclay et al.

(10) Patent No.: US 11,158,551 B2
(45) Date of Patent: Oct. 26, 2021

(54) MODULAR WLCSP DIE DAISY CHAIN DESIGN FOR MULTIPLE DIE SIZES

(71) Applicant: Dialog Semiconductor (UK) Limited, London (GB)

(72) Inventors: Duncan Barclay, Swindon (GB); Jesus Mennen Belonio, Jr., Neubiberg (DE); Edward Horsburgh, Devizes (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/736,077

(22) Filed: Jan. 7, 2020

(65) Prior Publication Data
US 2021/0210396 A1    Jul. 8, 2021

(51) Int. Cl.
H01L 21/66    (2006.01)
H01L 21/82    (2006.01)
H05K 3/34     (2006.01)
H01L 23/00    (2006.01)

(52) U.S. Cl.
CPC .............. *H01L 22/34* (2013.01); *H01L 21/82* (2013.01); *H01L 22/14* (2013.01); *H01L 22/32* (2013.01); *H01L 24/03* (2013.01); *H01L 24/05* (2013.01); *H01L 24/11* (2013.01); *H01L 24/13* (2013.01); *H01L 24/19* (2013.01); *H01L 24/20* (2013.01); *H01L 24/81* (2013.01); *H05K 3/3436* (2013.01); *H01L 2224/0401* (2013.01); *H01L 2924/01013* (2013.01)

(58) Field of Classification Search
CPC combination set(s) only.
See application file for complete search history.

(56) References Cited

U.S. PATENT DOCUMENTS

| | | | |
|---|---|---|---|
| 6,564,986 B1 | 5/2003 | Hsieh | |
| 7,982,475 B2 | 7/2011 | Russell et al. | |
| 8,633,601 B2 | 1/2014 | Kumbhat et al. | |
| 8,928,344 B2 | 1/2015 | Rathburn | |
| 10,048,306 B1 * | 8/2018 | Darbha | G01R 31/50 |
| 10,522,488 B1 * | 12/2019 | Chen | H01L 24/81 |
| 2009/0230554 A1 * | 9/2009 | Kaufmann | H01L 24/83 |
| | | | 257/738 |
| 2010/0062563 A1 * | 3/2010 | Pressel | H01L 25/0657 |
| | | | 438/106 |
| 2013/0037962 A1 * | 2/2013 | Xue | H01L 24/96 |
| | | | 257/774 |
| 2014/0159251 A1 * | 6/2014 | Marimuthu | H01L 23/481 |
| | | | 257/774 |

(Continued)

OTHER PUBLICATIONS

German Office Action, File No. 10 2020 202 663.7, Applicant: Dialog Semiconductor (UK) Limited, dated Jun. 9, 2020, 7 pages.

*Primary Examiner* — Mamadou L Diallo
(74) *Attorney, Agent, or Firm* — Saile Ackerman LLC; Stephen B. Ackerman; Rosemary L. S. Pike

(57) ABSTRACT

A method to fabricate a modular die daisy chain design for wafer level chip scale package (WLCSP) board level reliability testing is described. A wafer is provided having pairs of solder balls electrically connected to each other by underlying metal pads. The wafer is singulated into dies of any of a plurality of sizes as required for testing. Thereafter one of the singulated dies is mounted to a test printed circuit board (PCB). The pairs of solder balls are electrically connected in a daisy chain on the test PCB.

12 Claims, 6 Drawing Sheets

(56) References Cited

U.S. PATENT DOCUMENTS

| | | | |
|---|---|---|---|
| 2014/0183761 A1* | 7/2014 | Lin .................. | H01L 24/97 |
| | | | 257/787 |
| 2015/0243575 A1* | 8/2015 | Strothmann ............ | H01L 24/97 |
| | | | 257/773 |
| 2017/0084491 A1* | 3/2017 | Oratti Kalandar .... | H01L 21/561 |
| 2019/0067229 A1* | 2/2019 | Mohammed ............ | H01L 24/06 |
| 2019/0096815 A1* | 3/2019 | Belonio, Jr. ......... | H01L 23/5389 |
| 2019/0326254 A1* | 10/2019 | Hu .................... | H01L 24/96 |
| 2020/0091051 A1* | 3/2020 | Belonio, Jr. ......... | H01L 21/4857 |
| 2020/0395324 A1* | 12/2020 | Luan ................. | H01L 23/49816 |
| 2020/0399117 A1* | 12/2020 | Lin .................. | H01L 24/97 |

\* cited by examiner

MODULAR WLCSP DIE DAISY CHAIN DESIGN FOR MULTIPLE DIE SIZES

(1) TECHNICAL FIELD

This disclosure is related to die daisy chain designs and board level reliability testing, and more particularly, to modular die daisy chain designs for multiple die sizes.

(2) BACKGROUND

Daisy chain designs are used in semiconductor packaging to test the reliability of interconnections which are subjected to thermal and mechanical stresses in order to simulate the real environmental conditions to which the product will be subjected during its working life. The daisy chain design consists of paired connections which allow for a detection of failure or failures of individual interconnections where an electrical change in resistance in the connection signifies a failure.

Daisy chain packages are surface mounted (SMT) on a test printed circuit board (PCB) for the testing to be performed. The test PCB with the daisy chain package is then subjected to thermal and mechanical stress tests while the interconnect pattern is monitored for an electrical change in the resistance in the connections.

With current wafer level chip scale package (WLCSP) daisy chain designs a new wafer fab mask design and tooling is needed for each change in die/package size. Development and evaluation of the board level reliability (BLR) of new WLCSP die sizes can be slow. This is a concern since there is a current trend for increased size and aspect ratios of WLCSP's. With current WLCSP daisy chain designs, a complete new WLCSP tooling set is required in package assembly for each new die/package size. This is both costly and time consuming. An additional limitation of the current practice is that most current WLCSP daisy chain designs do not allow testing of wafer fab structures under the solder ball area.

U.S. Pat. No. 8,633,601 (Kumbhat et al), U.S. Pat. No. 7,982,475 (Russell et al), U.S. Pat. No. 6,564,986 (Hsieh), and U.S. Pat. No. 8,928,344 (Rathbun) and U.S. Patent Application 2008/0061812 (McElfresh et al) disclose various daisy chain test vehicles.

SUMMARY

It is the primary objective of the present disclosure to provide a modular die daisy chain design for all sizes of wafer level chip scale package (WLCSP) board level reliability testing.

It is another objective of the present disclosure to provide a modular die daisy chain design for wafer level chip scale package (WLCSP) board level reliability testing wherein different die/package sizes can be singulated from the same mask designs with no additional tooling.

A further objective is to provide a modular die daisy chain design for wafer level chip scale package (WLCSP) board level reliability testing that allows testing of wafer fab structures under the solder ball area.

In accordance with the objectives of the present disclosure, a modular die daisy chain design for wafer level chip scale package (WLCSP) board level reliability testing is achieved. A wafer is provided having pairs of solder balls electrically connected to each other by underlying metal pads. The wafer is singulated into dies of any of a plurality of sizes as required for testing. Thereafter one of the singulated dies is mounted to a test printed circuit board (PCB). The pairs of solder balls are electrically connected in a daisy chain on the test PCB.

Also in accordance with the objectives of the present disclosure, a method of designing a wafer level chip scale package (WLCSP) die daisy chain test vehicle is achieved. The method comprises designing a daisy chain test vehicle comprising metal pads on a substrate wafer, fabricating metal pads on the substrate wafer according to the design, covering the metal pads with a passivation layer, and providing first openings to the metal pads through the passivation layer wherein the metal pads are configured to electrically connect a plurality of pairs of overlying solder balls to each other. After a wafer level chip scale package (WLCSP) is designed and manufactured, the substrate wafer is singulated into dies of a size and shape required for testing the WLCSP. One of the singulated dies is mounted to a test printed circuit board (PCB) and the pairs of solder balls are electrically connected in a daisy chain on the test PCB in preparation for testing. The substrate wafer is singulated into dies of any of a plurality of sizes and shapes depending on the WLCSP design without redesign of the die daisy chain test vehicle.

Also in accordance with the objectives of the present disclosure, a method of wafer level chip scale package (WLCSP) board level reliability testing is achieved. A wafer level chip scale package (WLCSP) die daisy chain test vehicle is provided comprising a wafer having pairs of solder balls electrically connected to each other by underlying metal pads. The wafer is singulated into dies of any of a plurality of sizes as required for testing. Thereafter one of the singulated dies is mounted to a test printed circuit board (PCB). The pairs of solder balls are electrically connected in a daisy chain on the test PCB. Electrical connection is tested at a plurality of test points on the PCB and resistance of the daisy chain is tested at beginning and end points of the daisy chain.

BRIEF DESCRIPTION OF THE DRAWINGS

In the accompanying drawings forming a material part of this description, there is shown.

DETAILED DESCRIPTION

The present disclosure describes a modular die daisy chain design for wafer level chip scale package (WLCSP) board level reliability testing. The die daisy chain (DC)

modular design and the routing direction of the overall interconnections allow one die DC design to be used for multiple die/package sizes and either rectangular or square shapes.

Figure 1:
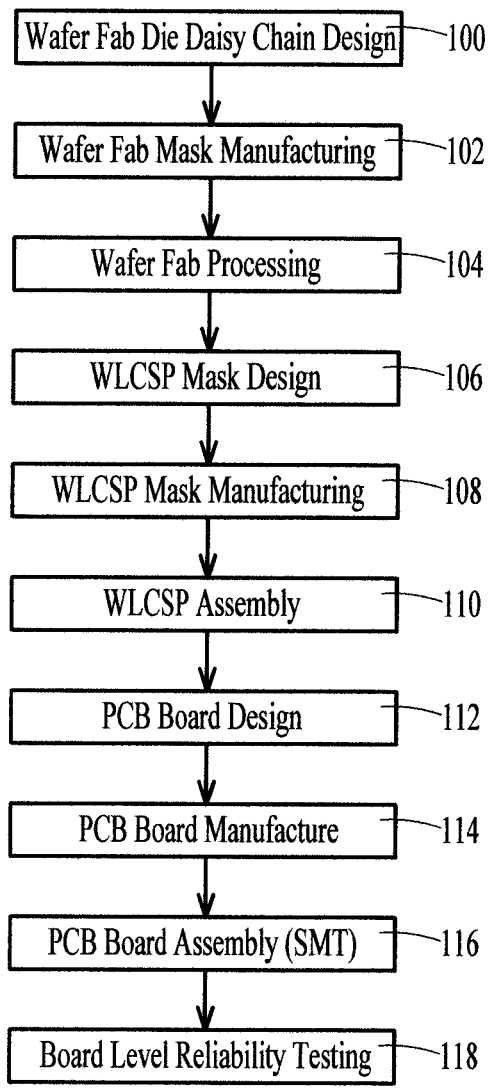
FIG. 1 is a flowchart of the process of the present disclosure.
Figure 2:
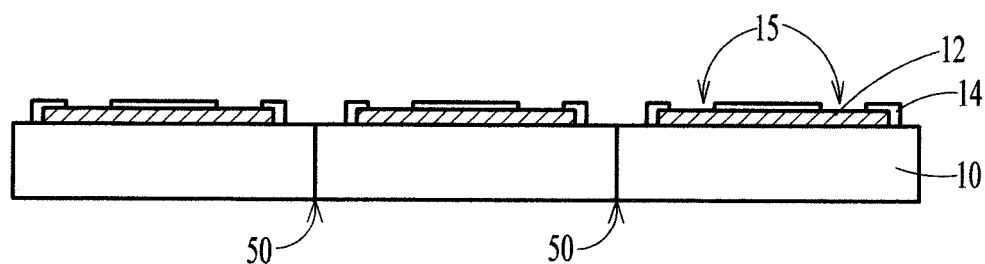
FIGS. 2-4 are cross-sectional representations of steps in a preferred embodiment of the process of the present disclosure.

FIG. 1 illustrates the modular WLCSP die daisy chain design process of the present disclosure. First in step 100 is the wafer fab die daisy chain design. Next, step 102, is the wafer fab mask manufacturing. Then, 104, is the wafer fab processing. FIG. 2 illustrates a wafer 10 that has completed wafer fab processing. Aluminum pads 12 have been formed on the wafer surface and passivated with passivation layer 14. Openings 15 have been etched through the passivation layer to the aluminum pads 12. The Daisy Chain design in Wafer Fab is the Al pad 12 connection between each pair of solder balls.

The process of the present disclosure saves on tooling costs in the Wafer Fab as only one bump mask tooling is needed per ball pitch. The spacing between the solder balls allows singulation of different die sizes. That is, some of the scribe lines may be used for singulation and some not, depending on the die size to be tested. Scribe lines can be different sizes and can be placed in different places, but are limited by the space between the minimum ball pitch.

Figure 3:
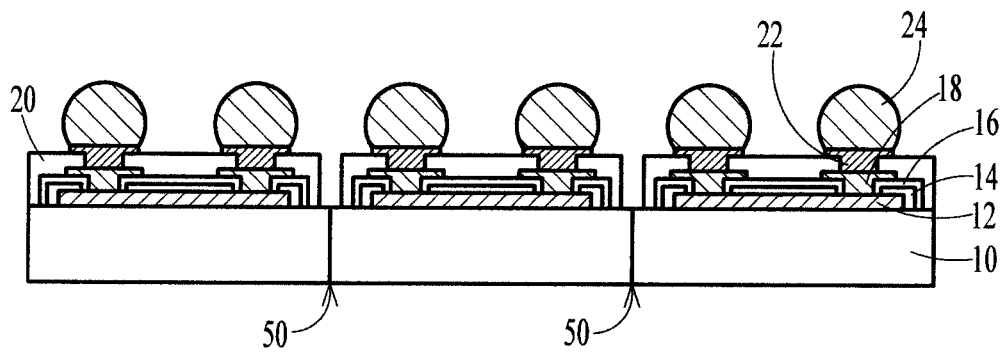
Figure 4:
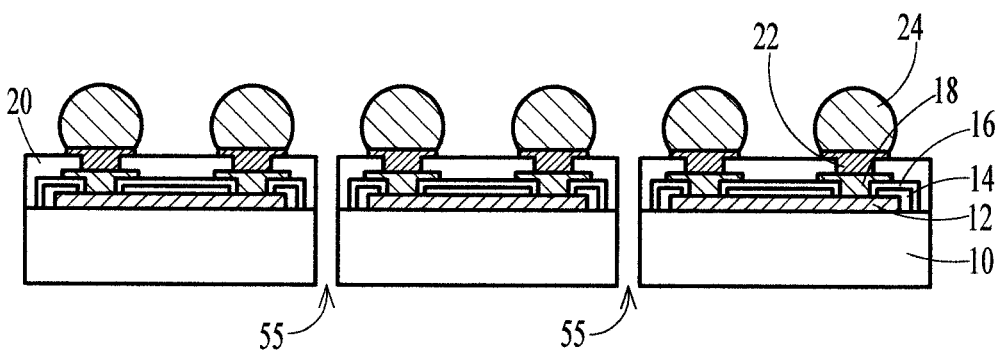

In step 106, the WLCSP mask is designed, the WLCSP mask is manufactured in0 step 108, and the WLCSP is processed in step 110. FIG. 3 illustrates a completed WLCSP assembly. This includes a first polymer layer 16 on the passivation layer 14, redistribution layer (RDL) 18 contacting the aluminum pad 12 through openings in the passivation and first polymer layers, second polymer layer 20, under bump metallization (UBM) layer 22, and solder balls 24. The polymer1/polymer2 masks will need to be tooled for each die/package size to be tested to prevent polymer material in the scribe channels. Minimal material should be in the scribe line area to make singulation easier and reduce the risk of chipping the die/package edge. The wafer is now singulated into separate dies. FIG. 4 illustrates a WLCSP cross-section example singulated 55 for a particular die size. FIG. 4 illustrates a standard four-layer WLCSP type; however, potentially the number of layers could be reduced for a lower cost WLCSP package type by reducing the layer structure while applying the modular design configuration of the present disclosure.

The process of the present disclosure saves tooling costs in assembly RDL, UBM, and Ball placement stencil design. It also saves on tooling time to get a Daisy Chain die design because wafers can be held in assembly and prepared to the die/package size required. The key feature of the process of the present disclosure is that the dies are singulated to the desired size and shape (rectangle, square, or other shape) and then mounted to the PCB for Board Level Reliability (BLR) testing.

The PCB is manufactured in step 114 and assembled in step 116 where the WLCSP is mounted to the PCB using surface mount technology (SMT). The Board Level Reliability (BLR) test is designed in step 118. The BLR test consists of thermal and mechanical tests. The BLR test PCB will need to be tooled for each die/package size to be tested.

The steps 100, 102, and 104 described above need to be completed only one time. The completed die/package can be singulated into a variety of patterns to provide devices for testing a variety of WLCSP package sizes.

Figure 5:
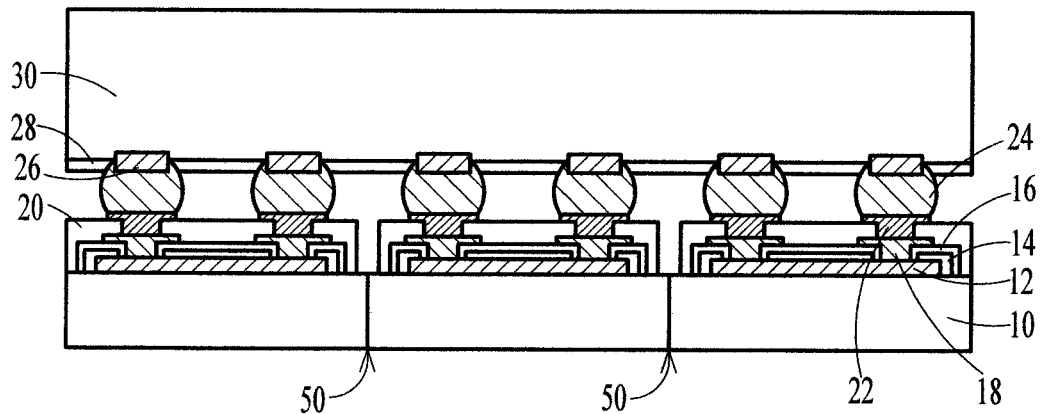
FIG. 5 is a cross-sectional representation of an example of a WLCSP die daisy chain pattern in a preferred embodiment of the present disclosure.

The structure (overlaps) of the Daisy Chain design can be generalized but the connection between them cannot be generalized. That is, the structures under the ball area can be different, but the connection from ball to ball is fixed. FIG. 5 illustrates the connection 26 between the balls 24 and the PCB 30.

Table 1 illustrates example requested die/package sizes to be evaluated in the first column and actual die/package sizes provided for testing in the second column. The actual die/package size is selected to be as close as possible to the requested die/package size to be evaluated. The sizes are not exactly as requested because of the fixed solder ball pitch in the WLCSP.

TABLE 1

| Requested Die Size to Evaluate | Actual Die Size |
| --- | --- |
| ~9 × 9 mm | 9.1 × 9.1 mm |
| ~10 × 10 mm | 9.8 × 9.8 mm |
| ~12 × 12 mm | 11.9 × 11.9 mm |
| ~15 × 15 mm | 14.7 × 14.7 mm |
| ~9 × 4 mm | 9.1 × 4.2 mm |
| ~10 × 5 mm | 10.5 × 4.9 mm |
| ~12 × 6 mm | 11.9 × 6.3 mm |

In the process of the present disclosure, one die Daisy Chain design is provided which can be arrayed and cut into multiple die/package sizes. This modular design means that no additional tooling is required to provide a test vehicle for a different sized WLCSP. All solder balls must be checked for each WLCSP size for connectivity; that is, are they connected in the chain and have resistance continuity.

A single unit modular design consists of: 1) the Wafer Fab Metal 12 and the Wafer Fab Passivation 14 and 2) typical WLCSP design structures under the ball 24 area including redistribution layer 18 and under bump metallurgy 22, such as the four-layer WLSCP illustrated in FIG. 3.

Figure 6:
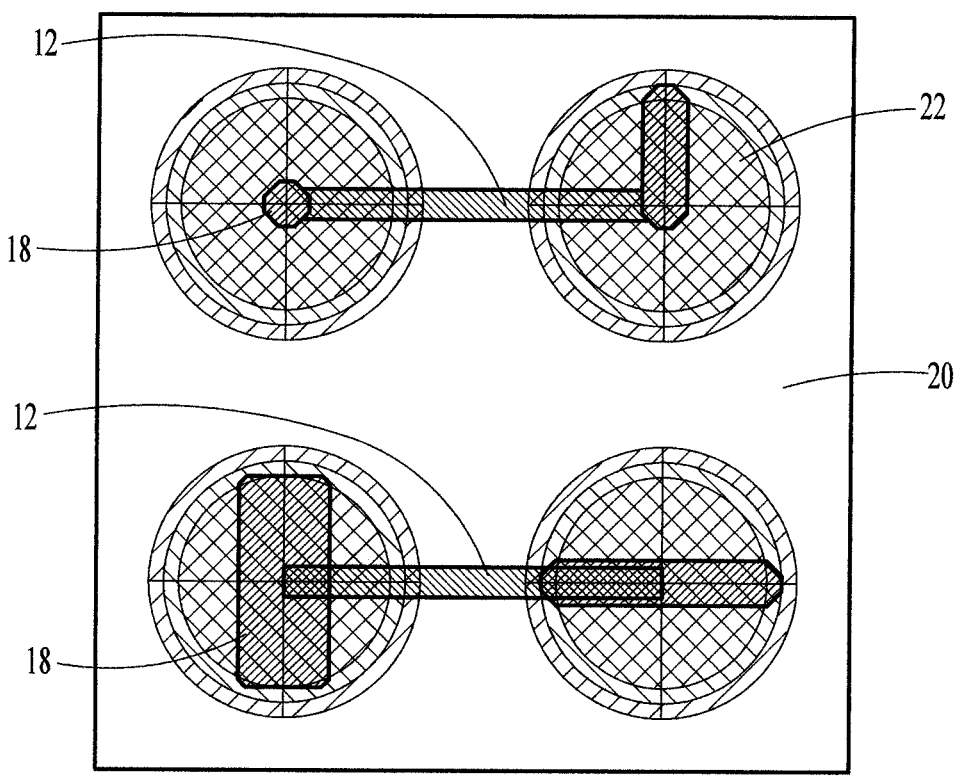
FIG. 6 is a top view of a single unit design in a preferred embodiment of the present disclosure.

FIG. 6 illustrates a single unit design 100 showing the aluminum pad 12 connecting each pair of solder balls 24. RDL layer 18 and UBM layer 22 are shown in FIG. 6. The solder balls, not shown, connect to each circular UBM contact 22.

Figure 7:
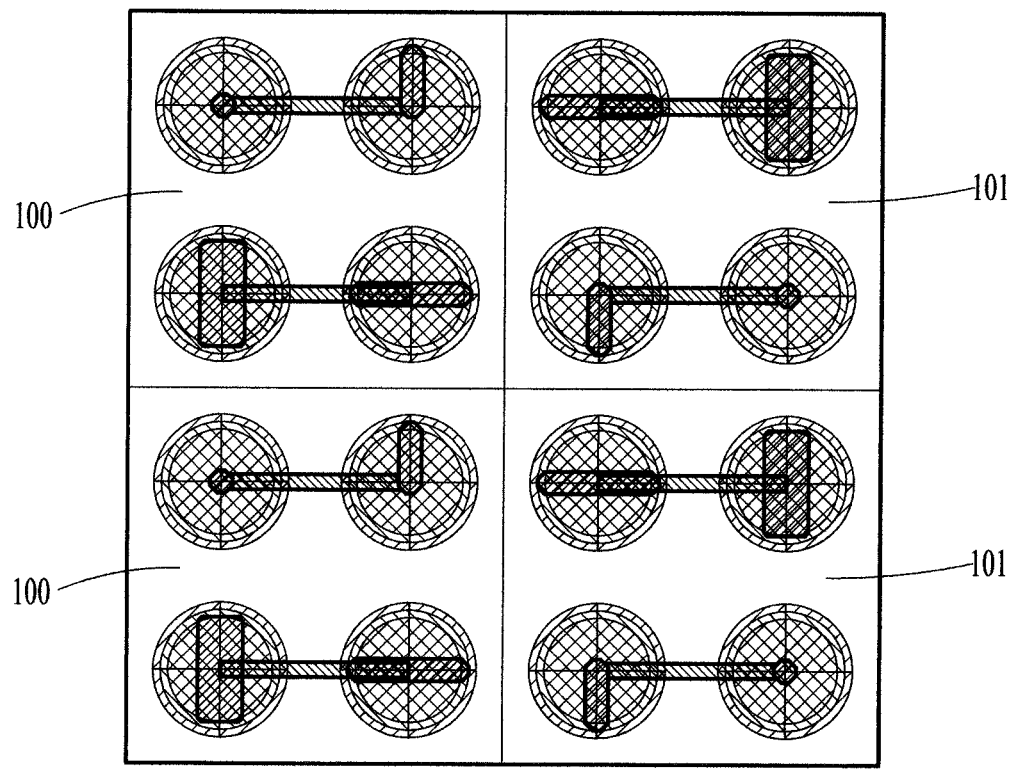
FIG. 7 is a top view of an array of the single unit design of FIG. 6 in a preferred embodiment of the present disclosure.
Figure 8:
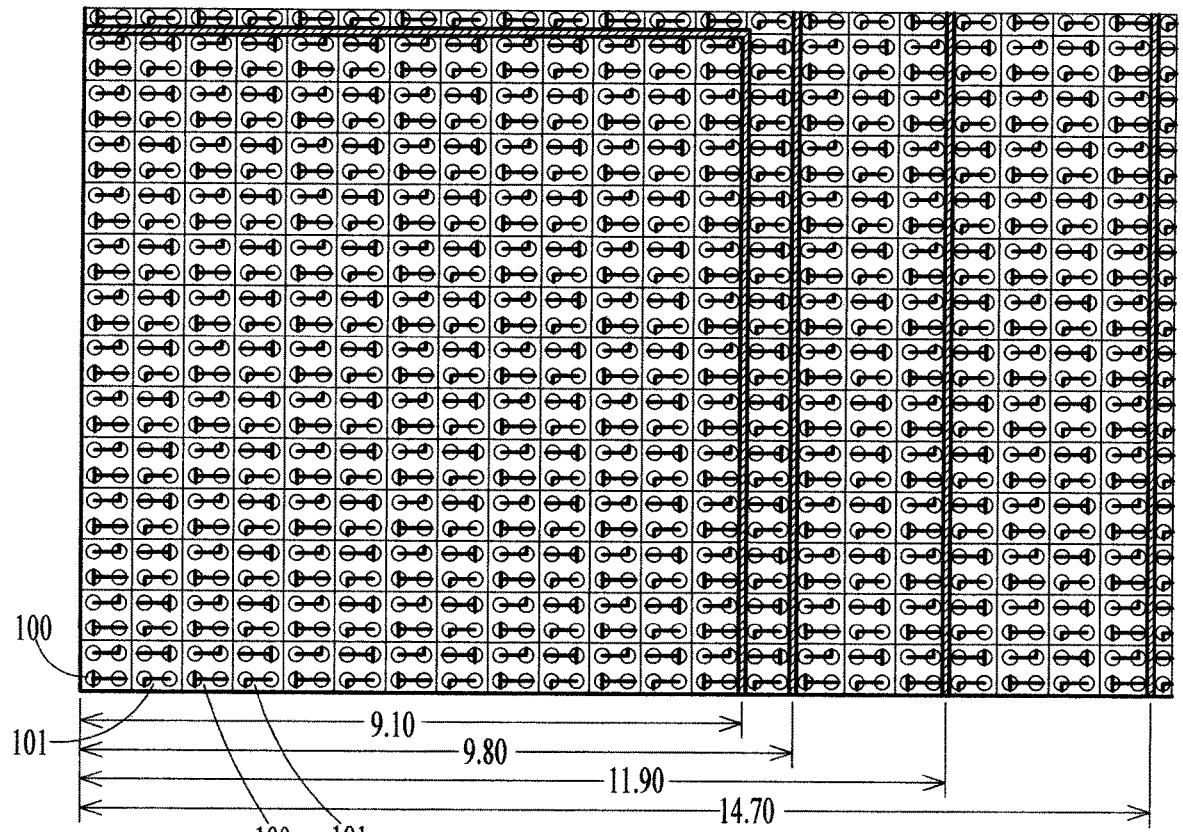
FIG. 8 is a top view of a daisy chain pattern in a preferred embodiment of the present disclosure.

FIG. 7 illustrates a portion of an array of the single unit designs shown in FIG. 6. FIG. 8 illustrates an array of units 100, 101 built to correspond to the requested die sizes. The first four actual die sizes in Table 1 are illustrated in FIG. 8.

Figure 9:
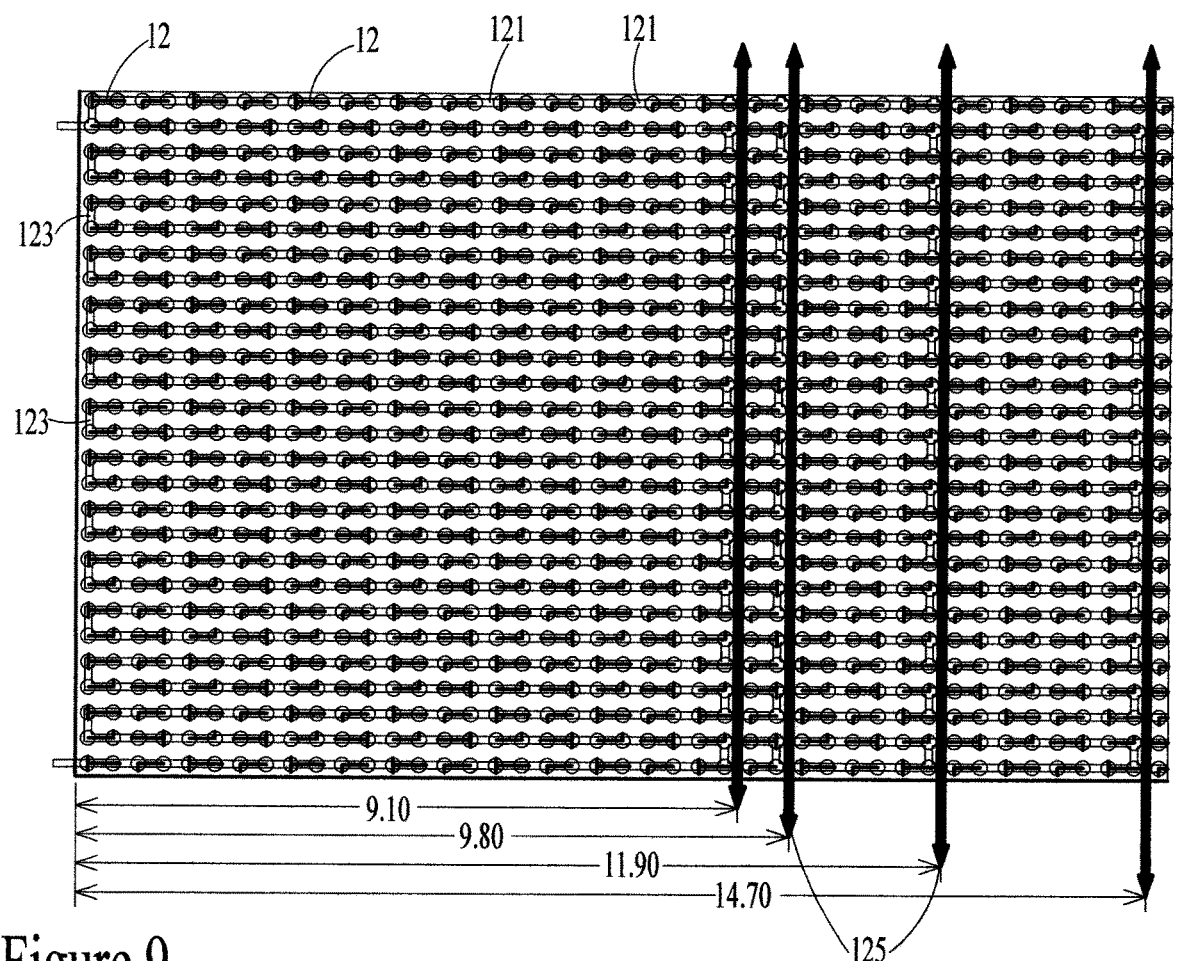
FIG. 9 is a top view of a die/PCB daisy chain pattern in a preferred embodiment of the present disclosure.

FIG. 9 illustrates the die/PCB daisy chain interconnect pattern. The die daisy chain and PCB chains are alternated to check full connectivity. Aluminum pad routing 12 is shown between solder balls in each unit cell in the horizontal direction. PCB routing is shown in both the horizontal direction 121 and in the vertical direction 123.

The process of the present disclosure allows the one die DC design to be used for multiple die sizes. This is because singulation can be done at different points between the pairs of solder balls, depending on the die/package size desired. The horizontal 121 and vertical 123 connections are made only when the singulated units are mounted onto the PCB. FIG. 9 also illustrates saw lines 125 for different die sizes.

Figure 10:
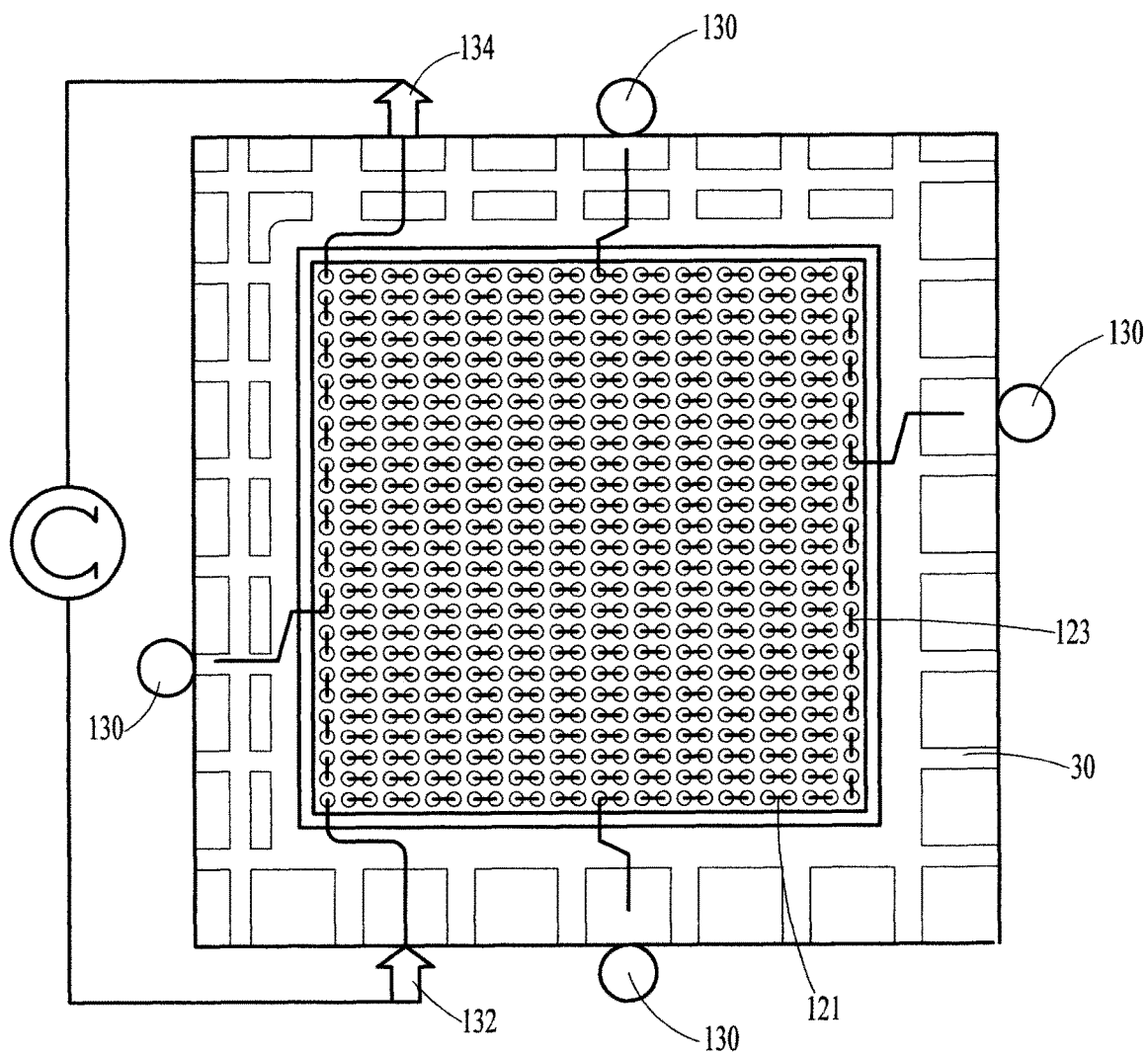
FIG. 10 is a top view of a PCB pattern example in a preferred embodiment of the present disclosure.

FIG. 10 illustrates a top view of a PCB pattern example for a particular die size. The WLCSP has been mounted on the PCB 30 and vertical connections 123 and horizontal connections 121 have been made between the solder ball pairs. Test points 130 are used to check electrical connections. As the daisy chain has in-series connections between different pins, one could be flexible and assign any checkpoint to trace the continuity and resistance of the interconnect structure on the PCB or in any vertical or horizontal connection. The resistance of the chain is measured at the start of the chain 132 and at the end of the chain 134.

The process of the present disclosure enables early assessment of Process Assembly Behavior, Board Level Reliability and Design consideration guidelines that may apply to the actual device. It enables future development ideas related to component size, material sets, and process parameters between first level WLCSP and SMT assembly between the WLCSP and PCB. No equipment investment is needed for the process of the present disclosure; existing equipment and process methodology are used. The universal flexibility of the modular design of the die daisy chain enables handling of different die sizes in the WLCSP, whether rectangular or square or other shape, by assessing Board Level Reliability in a one time lay-out and tape-out approach rather than requiring different or multiple RDL lay-outs.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a wafer level chip scale package (WLCSP) die daisy chain test vehicle comprising:
designing a die daisy chain test vehicle comprising daisy-chained metal pads on a substrate wafer; and
for each required die/package size, repeating the steps of:
manufacturing a wafer level chip scale package on said die daisy chain test vehicle having pairs of solder balls electrically connected to each other by said daisy-chained metal pads underlying said solder balls;
thereafter singulating said wafer into dies of required said die/package size and shape as required for testing;
thereafter mounting singulated said dies to a test printed circuit board (PCB); and
thereafter electrically connecting said daisy-chained pairs of solder balls to a daisy chain on said test PCB.

2. The method according to claim 1 further comprising:
forming first openings to said metal pads on said wafer through an overlying passivation layer;
covering said passivation layer with a first polymer layer;
forming a redistribution metal layer contacting said metal pads through second openings in said first polymer layer and underlying said first openings;
covering said redistribution metal layer with a second polymer layer and forming third openings in said second polymer layer to said redistribution metal layer;
forming under ball metallization contacting said redistribution metal layer in said third openings; and
placing solder balls on said under ball metallization.

3. The method according to claim 1 wherein said metal pads comprise aluminum.

4. The method according to claim 1 wherein said plurality of shapes comprises rectangular and square.

5. A method of designing a wafer level chip scale package (WLCSP) die daisy chain test vehicle comprising:
designing a die daisy chain test vehicle comprising metal pads on a substrate wafer;
fabricating a plurality of said die daisy chain test vehicles, comprising the steps:
fabricating metal pads on said substrate wafer;
covering said metal pads with a passivation layer; and
providing first openings to said metal pads through said passivation layer wherein said metal pads are configured to electrically connect a plurality of pairs of overlying solder balls to each other in a daisy chain; and
for each required die/package size, repeating the steps of:
i) designing a wafer level chip scale package (WLCSP) using only one mask;
ii) thereafter manufacturing said WLCSP on one of said die daisy chain test vehicles; and
iii) thereafter singulating said substrate wafer into dies of a size and shape required for testing said WLCSP without redesign of said die daisy chain test vehicle.

6. The method according to claim 5 wherein said manufacturing said WLCSP comprises forming at least one redistribution metal layer contacting each of said metal pads through said first openings and through second openings in a first polymer layer over said passivation layer, and solder balls contacting each of said redistribution metal layers.

7. The method according to claim 6 further comprising underbump metallization under each of said solder balls through third openings in a second polymer layer to said redistribution metal layers over said first polymer layer.

8. The method according to claim 5 further comprising:
mounting singulated said dies to a test printed circuit board (PCB); and
electrically connecting said pairs of solder balls in a daisy chain on said test PCB.

9. The method according to claim 5 wherein said metal pads comprise aluminum.

10. A method of board level reliability (BLR) testing comprising:
providing a wafer level chip scale package (WLCSP) die daisy chain test vehicle comprising:
a modular design die daisy chain test vehicle comprising metal pads on a substrate wafer;
pairs of solder balls electrically connected to each other by underlying said metal pads, said substrate wafer singulated into dies of any of a plurality of sizes and shapes as required for said BLR testing without redesign of said die daisy chain test vehicle for any of said plurality of sizes and shapes; and
singulated said dies mounted onto a test printed circuit board (PCB) wherein said pairs of solder balls are electrically connected in a daisy chain on said test PCB;
testing electrical connection at a plurality of test points on said singulated dies; and
testing resistance of said daisy chain at beginning and end points of said daisy chain.

11. The method according to claim 10 further comprising:
a redistribution metal layer contacting said metal pads through first openings in a first polymer layer; and
under ball metallization contacting said redistribution metal layer through second openings in a second polymer layer over said first polymer layer wherein said solder balls contact said under ball metallization.

12. The method according to claim 10 wherein said metal pads comprise aluminum.

* * * * *